(12) United States Patent
Park et al.

(10) Patent No.: US 10,790,133 B2
(45) Date of Patent: Sep. 29, 2020

(54) PRECLEANING APPARATUS AND SUBSTRATE PROCESSING SYSTEM

(71) Applicant: Samsung Electronics Co., Ltd., Suwon-si, Gyeonggi-do (KR)

(72) Inventors: Keum Seok Park, Seoul (KR); Sun Jung Kim, Suwon-si (KR); Yi Hwan Kim, Seongnam-si (KR); Pan Kwi Park, Incheon (KR); Dong Suk Shin, Yongin-si (KR); Hyun Kwan Yu, Suwon-si (KR); Seung Hun Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 695 days.

(21) Appl. No.: 15/416,408

(22) Filed: Jan. 26, 2017

(65) Prior Publication Data

US 2018/0025901 A1 Jan. 25, 2018

(30) Foreign Application Priority Data

Jul. 22, 2016 (KR) ........................ 10-2016-0093548

(51) Int. Cl.
*B08B 7/00* (2006.01)
*B08B 7/04* (2006.01)
(Continued)

(52) U.S. Cl.
CPC ...... *H01L 21/02057* (2013.01); *B08B 7/0035* (2013.01); *B08B 7/04* (2013.01); *H01J 37/32091* (2013.01); *H01J 37/32889* (2013.01); *H01L 21/0262* (2013.01); *H01L 21/02532* (2013.01); *H01L 21/02639* (2013.01); *H01L 21/67034* (2013.01); *H01L 21/67109* (2013.01); *H01L 21/67167* (2013.01); *H01L 21/67184* (2013.01); *H01L 21/67201* (2013.01); *H01L 21/6831* (2013.01); *H01L 21/68707* (2013.01); *H01L 21/68742* (2013.01);
(Continued)

(58) Field of Classification Search
CPC ... B08B 7/0035; B08B 7/04; H01L 21/02057; H01L 21/67034; H01L 21/67184; H01L 21/67201; H01L 21/68707; H01L 29/66636
USPC .......................................... 134/1.2, 61, 902
See application file for complete search history.

(56) References Cited

U.S. PATENT DOCUMENTS 7,651,948 B2 1/2010 Kim et al.
8,017,487 B2 9/2011 Chong et al.
(Continued)

FOREIGN PATENT DOCUMENTS

KR 10-0968421 7/2010
KR 2010-0113317 10/2010
KR 2016-0040649 4/2016

*Primary Examiner* — Levon J Shahinian
(74) *Attorney, Agent, or Firm* — Myers Bigel, P.A.

(57) ABSTRACT

A precleaning apparatus includes a chamber having an internal space in which a substrate is cleaned, a substrate support disposed in the chamber and configured to support the substrate, a plasma generation unit disposed in the chamber and configured to generate plasma gas, a heating unit configured to heat the substrate on the substrate support, a cleaning gas supply unit configured to supply gas for oxide etching to the internal space of the chamber, and a hydrogen gas supply unit configured to supply hydrogen gas to the internal space of the chamber.

13 Claims, 7 Drawing Sheets

(51) Int. Cl.
  *H01L 21/02*    (2006.01)
  *H01L 21/67*    (2006.01)
  *H01L 21/687*   (2006.01)
  *H01L 29/66*    (2006.01)
  *H01J 37/32*    (2006.01)
  *H01L 21/683*   (2006.01)
  *H01L 29/78*    (2006.01)
  *H01L 29/165*   (2006.01)

(52) U.S. Cl.
  CPC .. *H01L 29/66628* (2013.01); *H01L 29/66636* (2013.01); *H01L 29/66659* (2013.01); *H01L 29/7848* (2013.01); *H01J 2237/335* (2013.01); *H01L 29/165* (2013.01)

(56)   References Cited

U.S. PATENT DOCUMENTS

| | | |
|---|---|---|
| 8,471,307 B2 | 6/2013 | Khamankar et al. |
| 2007/0093071 A1* | 4/2007 | Verhaverbeke ........... G03F 7/16 |
| | | 438/724 |
| 2012/0210937 A1 | 8/2012 | Thakur et al. |
| 2013/0052809 A1 | 2/2013 | Tung |
| 2015/0024567 A1 | 1/2015 | Tsai et al. |
| 2016/0148789 A1 | 5/2016 | Chen et al. |

* cited by examiner

PRECLEANING APPARATUS AND
SUBSTRATE PROCESSING SYSTEM

CROSS-REFERENCE TO RELATED
APPLICATION(S)

This application claims the benefit of priority to Korean Patent Application No. 10-2016-0093548, filed on Jul. 22, 2016 in the Korean Intellectual Property Office, the disclosure of which is incorporated herein by reference in its entirety.

BACKGROUND

The present inventive concept relates to a cleaning apparatus used before epitaxial deposition and a substrate processing system including the same.

In general, semiconductor devices are manufactured by a number of unit processes including a thin-film deposition process and an etching process. After the etching process, etching residue components such as oxides may remain, and a precleaning process for the removal of residues, before epitaxial regrowth, is required.

As semiconductor devices have gradually been miniaturized and low-dielectric materials have been used therein for improvements of performance, precleaning processes have become more complex, and furthermore, actual residues may not properly removed, leading to defects in epitaxial growth.

SUMMARY

An aspect of the present inventive concept is to provide a precleaning apparatus for effectively removing a residue containing impurity elements in addition to oxides, and a substrate processing system including the same.

According to an aspect of the present inventive concept, a precleaning apparatus includes a chamber having an internal space in which a substrate is cleaned, a substrate support disposed in the chamber and configured to support the substrate, a plasma generation unit disposed in the chamber and configured to generate plasma gas, a heating unit configured to heat the substrate on the substrate support, a cleaning gas supply unit configured to supply gas for oxide etching to the internal space of the chamber, and a hydrogen gas supply unit configured to supply hydrogen gas to the internal space of the chamber.

According to an aspect of the present inventive concept, a substrate processing system includes a load-lock chamber having an internal space configured to accommodate a substrate and to allow a pressure reduction therein, a transfer chamber connected to the internal space of the load-lock chamber and including a transfer robot configured to transport the substrate, a cleaning chamber adjacent the transfer chamber and configured to clean the substrate transported from the transfer chamber by the transfer robot, and a plurality of process chambers adjacent the transfer chamber and configured to process the substrate transported from the transfer chamber by the transfer robot. A plasma generation unit configured to generate plasma gas and a heating unit configured to heat the substrate are disposed in an internal space of the cleaning chamber. The substrate processing system further includes a cleaning gas supply unit configured to supply gas for oxide etching to the cleaning chamber and a hydrogen gas supply unit configured to supply hydrogen gas to the cleaning chamber.

According to an aspect of the present inventive concept, a method of precleaning a substrate includes heat-treating a substrate having a contaminated or damaged portion under a hydrogen atmosphere at a temperature of 800° C. or lower within a cleaning chamber, removing an oxide from the contaminated or damaged portion of the substrate using plasma etching, and removing a surface layer of the contaminated or damaged portion using a halogen-based gas. These steps may be performed in a different or optional order within a single chamber.

According to an aspect of the present inventive concept, a precleaning apparatus includes a chamber, a substrate support in an internal space of the chamber and configured to support a substrate having a contaminated or damaged portion, a heating unit configured to heat the substrate on the substrate support, a hydrogen gas supply unit configured to supply hydrogen gas to the internal space of the chamber to heat-treat the heated substrate; a plasma generation unit disposed in the chamber and configured to generate plasma gas; a cleaning gas supply unit configured to supply gas to the internal space of the chamber to remove an oxide from the contaminated or damaged portion of the substrate using plasma etching, and a halogen gas supply unit configured to supply halogen gas to the internal space of the chamber to remove a surface layer of the contaminated or damaged portion of the substrate.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

According to an example embodiment of the present inventive concept, in cleaning an etched surface of a semiconductor substrate, in addition to a process of removing oxides from the etched surface, at least one of a hydrogen ($H_2$)-baking process of performing a heat treatment under a hydrogen atmosphere at a temperature of 800° C. or below and a process of etching a semiconductor layer from the etched surface may be additionally performed.

Undesired impurities such as carbon (C) may be removed from a damaged surface of a semiconductor substrate using a hydrogen baking process or may be outwardly diffused adjacent the surface. By additionally removing a semiconductor surface layer such as a silicon layer after the removal of oxide, a damaged surface may be further effectively removed.

In some example embodiments, the hydrogen baking process may be performed before removal of oxides and/or removal of a semiconductor surface layer, for example, an Si layer. In this case, an oxide layer or a damaged region, together with impurity elements having been diffused to a semiconductor surface layer, may be effectively removed (see FIG. 7).

In terms of devices, hydrogen baking, removal of oxides, and removal of a semiconductor layer may be carried out in a single chamber. By configuring a heater for hydrogen baking in a precleaning apparatus for plasma etching and configuring the precleaning apparatus to allow for a supply of a further etching gas thereto, a process of reforming or restoring a surface damaged by etching may be efficiently performed in-situ. Epitaxial regrowth may also be efficiently performed through effective removal of a damaged region contaminated with impurities such as carbon (see FIG. 8).

Difficulty in effective cleaning may be present due to a structural change in miniaturized devices, for example, an increase in a trench aspect ratio. Furthermore, cleaning may not be sufficient with only removal of oxide due to contamination by desired impurities generated from a new material introduced for improvement of performance, for example, a low-k dielectric material.

In detail, since a carbon component may remain on an etched surface and a region adjacent thereto even after the removal of oxides, epitaxial regrowth may not be smoothly performed locally. In order to solve the problem as described above, a scheme in which a process of removing a semiconductor surface layer, such as a silicon layer, may be additionally provided together with a heat treatment under a hydrogen atmosphere or hydrogen baking, according to some example embodiments.

Hereinafter, various example embodiments of the present inventive concept will be described with reference to the accompanying drawings.

FIGS. 1 to 6 are views illustrating processes of manufacturing a semiconductor device, in which a precleaning process according to an example embodiment is employed.

Figure 1:
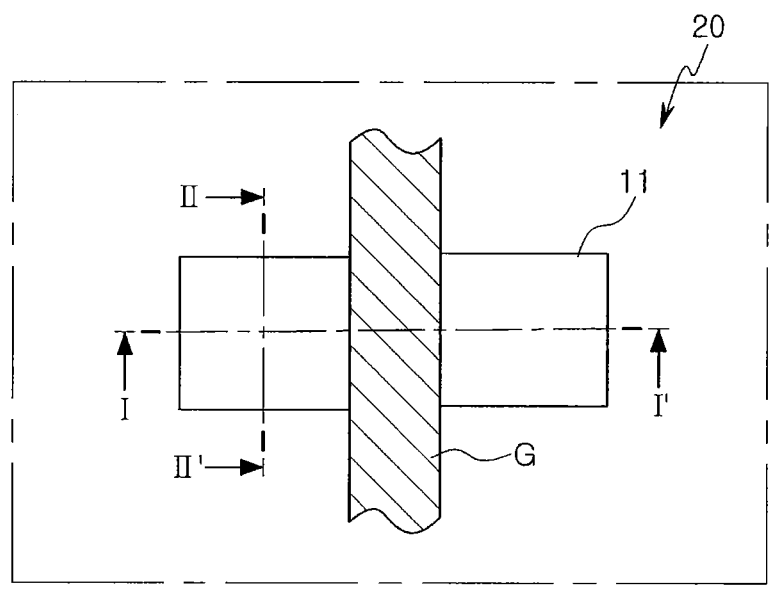
FIG. 1 is a plan view of a semiconductor device according to an example embodiment.

In detail, FIG. 1 is a plan view of a semiconductor device according to an example embodiment, and FIGS. 2 to 6 are cross-sectional views illustrating principal processes in a method of manufacturing a semiconductor device according to an example embodiment. In FIGS. 2 to 6, cross-sectional views of a semiconductor device taken along lines I-I' and II-II' of FIG. 1 are illustrated.

Figure 2:
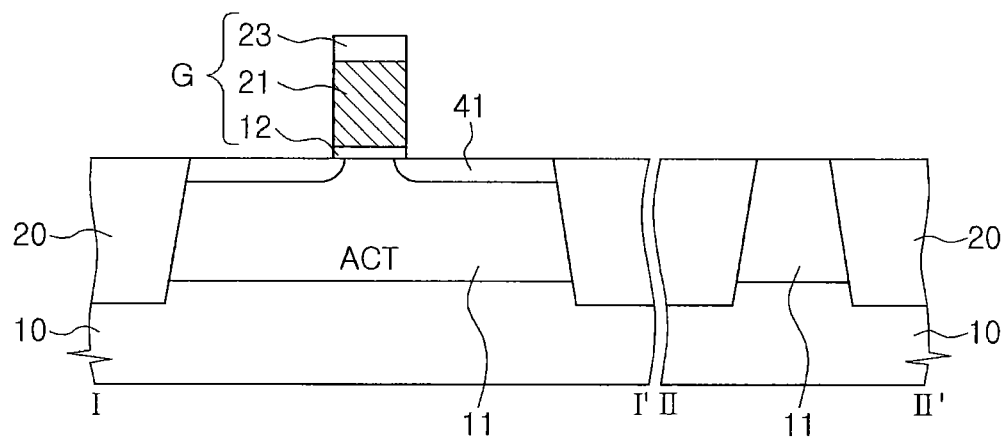
FIGS. 2 to 6 are cross-sectional views illustrating principal processes of a method of manufacturing a semiconductor device according to an example embodiment, taken along lines I-I' and II-II' of FIG. 1.

With reference to FIGS. 1 and 2, a structure G for a gate electrode may be formed on an active region ACT of a semiconductor substrate 10.

The semiconductor substrate 10 employed in the example embodiment may be a single crystal silicon substrate. For example, the semiconductor substrate 10 may be a silicon substrate having a (100) plane. Alternatively, the semiconductor substrate 10 may be a silicon-on-insulator (SOI) substrate, a germanium (Ge) substrate, a germanium-on-insulator (GOI) substrate, or a silicon-germanium substrate.

The active region ACT (or 11) may be a silicon or silicon germanium substrate. The active region ACT may be formed by a device isolation film 20. The device isolation film 20 may be formed by forming a trench in the semiconductor substrate 10 and by filling the trench with an insulating material. The insulating material filling the trench may be an insulating material having excellent gap filling characteristics. For example, the insulating material may be a material such as boron-phosphor silicate glass (BPSG), high density plasma (HDP) oxide, undoped silicate glass (USG), or tonen silazene (TOSZ).

The semiconductor substrate 10 may include a well region doped with an impurity to form metal oxide semiconductor (MOS) transistors. According to an example embodiment, the semiconductor substrate 10 may include an n-type well for the formation of PMOS transistors.

At this stage, the gate electrode structure G may include a gate insulating layer 12, a gate electrode 21, and a capping layer 23 sequentially disposed on the active region ACT. The gate insulating layer 12 may include at least one of a silicon oxide layer, a silicon nitride layer, a silicon oxynitride layer, and a high dielectric layer. The high dielectric layer may be a layer formed using insulating materials having a higher dielectric constant than silicon oxide, and may include a tantalum oxide layer, a titanium oxide layer, a hafnium oxide layer, a zirconium oxide layer, an aluminum oxide layer, an yttrium oxide layer, a niobium oxide layer, a cesium oxide layer, an indium oxide layer, an iridium oxide layer, a barium strontium titanate (BST) layer, and a zirconate titanate (PZT) layer. The gate insulating layer 12 may be a monolayer structure, but may also be a multilayer structure as desired or required.

The gate electrode 21 may be disposed on the gate insulating layer 12 and may be formed to intersect the active region ACT. For example, the gate electrode 21 may be formed of a polysilicon film doped with an impurity. In a manner similar to the example embodiment, in the case of a PMOS transistor, the gate electrode 21 may include a polysilicon film doped with a p-type impurity. Alternatively, the gate electrode 21 may be formed of a conductive material having a relatively low specific resistance and a high work function. For example, the gate electrode 21 may be formed of at least one of a metal such as tungsten (W) or molybdenum (Mo), and a conductive metal compound such as titanium nitride, tantalum nitride, tungsten nitride, and titanium aluminum nitride, as a conductive material having a high work function.

As illustrated in FIG. 2, low concentration impurity regions 41 may be formed in the active region ACT on both sides of the gate electrode structure G. In the case of a PMOS transistor as in the example embodiment, the low concentration impurity regions 41 may be doped with a p-type impurity such as boron (B). The low concentration impurity regions 41 may be formed via an ion implantation process using a mask in a state in which a spacer 30 (FIG. 3) is not provided on the gate electrode structure G. A portion of the low concentration impurity region 41 may extend to a lower portion of a finally-formed gate electrode structure G by impurity diffusion. The low concentration impurity region 41 formed in this stage may be provided together with a high concentration impurity region 43 (FIG. 3), as impurity regions for source and drain regions, in a subsequent process.

Figure 3:
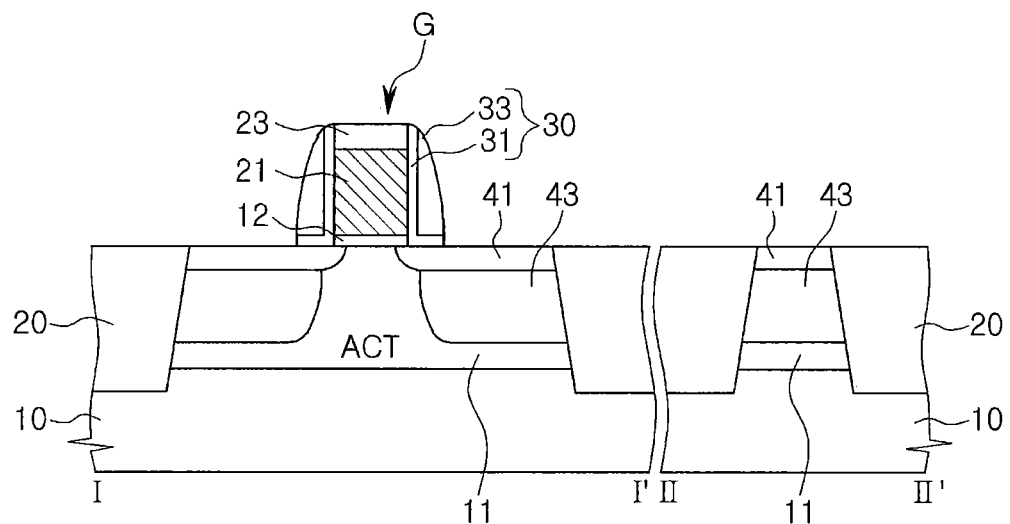

Next, as illustrated in FIG. 3, spacers 30 may be formed on both side walls of the gate electrode structure G illustrated in FIG. 2.

The spacers 30 may respectively be provided as a plurality of spacers 31 and 33, and may have a structure in which insulating materials having etch selectivity characteristics are alternately provided on each other.

In detail, in the example embodiment, the spacers 30 may be formed by conformally depositing an insulating layer on a front surface of the semiconductor substrate 10 on which the gate electrode 21 has been formed and then by performing a front surface anisotropic etching process such as an etchback process thereon. The silicon oxide layer may be formed using a chemical vapor deposition (CVD) or thermal oxidation process. The silicon oxide layer as described above may be used for repairing etching damage generated on a sidewall of the gate electrode 21.

Subsequently, by etching back the silicon oxide layer and a silicon nitride layer stacked sequentially, the spacers 30, for example, a dual spacer, including a first spacer 31 having an L shape and a second spacer 33 disposed on the first spacer 31, may be formed. As in the example embodiment, by providing the dual spacer 30, a short channel effect in that a channel length, or a distance between source/drain regions, is reduced due to high integration of a semiconductor device may be reduced.

After the dual spacer 30 is formed, high concentration impurity regions 43 may be formed in the semiconductor substrate 10 on both sides of the gate electrode structure G. The high concentration impurity regions 43 may be formed via implantation of a p-type impurity, for example, boron (B), by using the gate electrode structure G provided with the spacer 30 thereon as an ion implantation mask. In this case, the high concentration impurity regions 43 may be formed to have a depth greater than that of a recess R (see FIG. 4) to be formed in a subsequent process. A portion of the high concentration impurity region 43 may also be diffused to a lower portion of the spacer 30.

Figure 4:
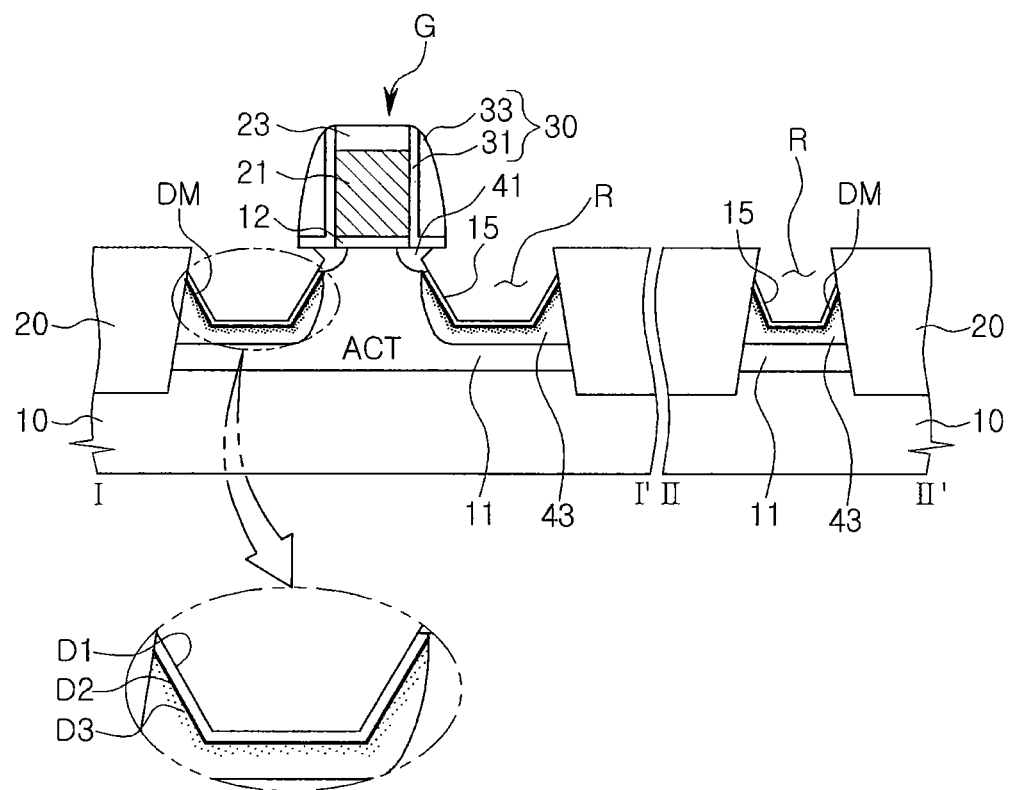
Figure 5:
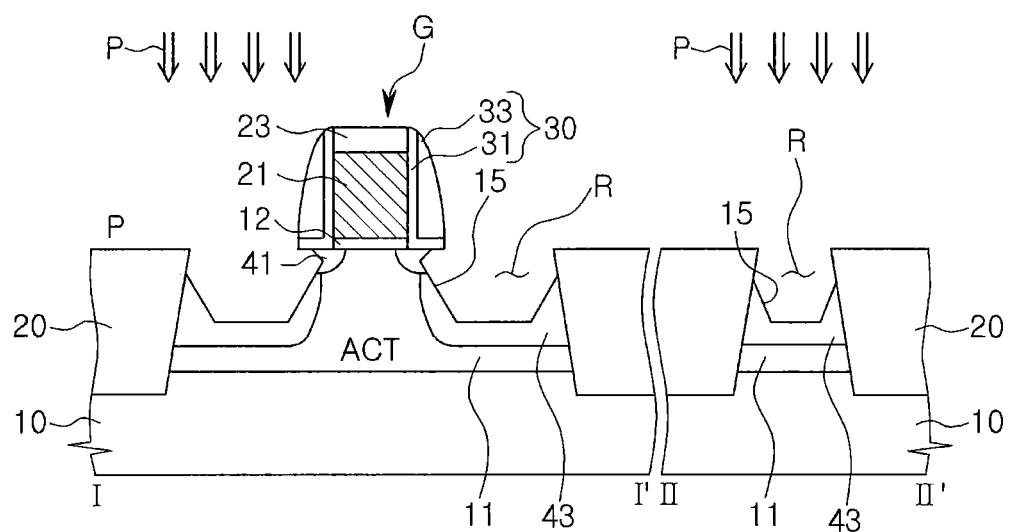

Subsequently, as illustrated in FIG. 4, the active region ACT on both sides of the gate electrode structure G may be selectively etched to form the recesses R.

The recess R may be formed via anisotropic and/or isotropic etching using the gate electrode structure G as an etching mask. In the example embodiment, the recesses R may be provided on both sides of the gate electrode and may be defined by bottom surfaces thereof parallel to an upper surface of the semiconductor substrate 10 and side surfaces thereof inclined with respect to the upper surface of the semiconductor substrate 10. In addition, for example, when the recess R is formed in the semiconductor substrate 10 between the gate electrode 21 and the device isolation film 20, the recess R may allow a side wall of the device isolation film 20 to be exposed.

For example, when an upper surface of the semiconductor substrate 10 has a (100) plane, the bottom surface of the recess R may have the (100) plane, and a side surface thereof adjacent to the gate electrode structure G may have a (111) plane, a (110) plane, and a (311) plane. As in the example embodiment, the recess R may extend to a lower portion of the gate electrode structure G.

The recess R may allow the low concentration impurity region 41 and the high concentration impurity region 43 to be exposed. On the other hand, the recess R may not allow an n-well or the semiconductor substrate 10 to be exposed. For example, a depth of the recess R from an upper surface of the semiconductor substrate 10 may be within a range of about 300 to 1000 Å.

As described above, the recess R may be obtained by etching the semiconductor substrate 10 or, in more detail, the active region ACT, by using the gate electrode structure G as an etching mask.

In a detailed example, the trench may be formed by performing an isotropic or anisotropic dry etching process on the active region ACT using the gate electrode structure G and the device isolation film 20 as an etching mask. In this case, HCl, $Cl_2$ or $H_2$ may be used as an etchant. A trench formed by an anisotropic etching process may be formed to have a depth shallower than that of the recess R. Then, by providing the trench with an etching liquid for isotropic etching to be applied thereto, a bottom surface and side surfaces of the recess R may be provided as specific crystal planes. In further detail, as an etchant for the isotropic etching process, an organic alkali etchant, for example, tetramethyl ammonium hydroxide (TMAH) or ammonium hydroxide ($NH_4OH$) may be used. The trench may be expanded by the isotropic etching process to thus form the recess R illustrated in FIG. 4. Alternatively, the recess R may be formed using an anisotropic dry etching process, such as chemical vapor etching (CVE). In this case, HCl or $H_2$ may be used as an etching gas.

By the anisotropic and/or isotropic etching process, as well as a surface of the recess R, an internal region of the recess R adjacent thereto may also be contaminated with impurities generated from the etchant and residues thereof, and a crystal thereof may be damaged. Not only the residues such as an oxide layer present on the surface of the recess R, but also undesired impurity elements such as carbon (C) or nitrogen (N) may be adsorbed on the surface of the recess R or an internal region adjacent thereto. In detail, as schematically illustrated in FIG. 4, in an etched surface region or damage region DM of the recess R, silicon oxide ($SiO_x$) D2 in which carbon has been employed and a silicon layer D3 in which carbon has been employed, as well as an oxide layer D1, may be present.

Thus, after the recess R is formed, the oxide layer D1 may be removed with only a cleaning process, e.g., a SiCoNi process, according to the related art, but the silicon oxide D2 in which carbon has been employed and the silicon layer D3 in which carbon has been employed may still remain, which may cause the occurrence of a defect in a subsequent regrowth process.

In the cleaning process employed in the example embodiment, a silicon etching process of removing a relatively thin silicon layer in which carbon remains may be performed together with a hydrogen baking process in which carbon is outwardly diffused, discharged, and removed from the damage region DM. Via the processes described above, the damaged surface employing an impurity therein may be effectively cleaned. A process related thereto will be described in more detail with reference to FIG. 7.

Figure 6:
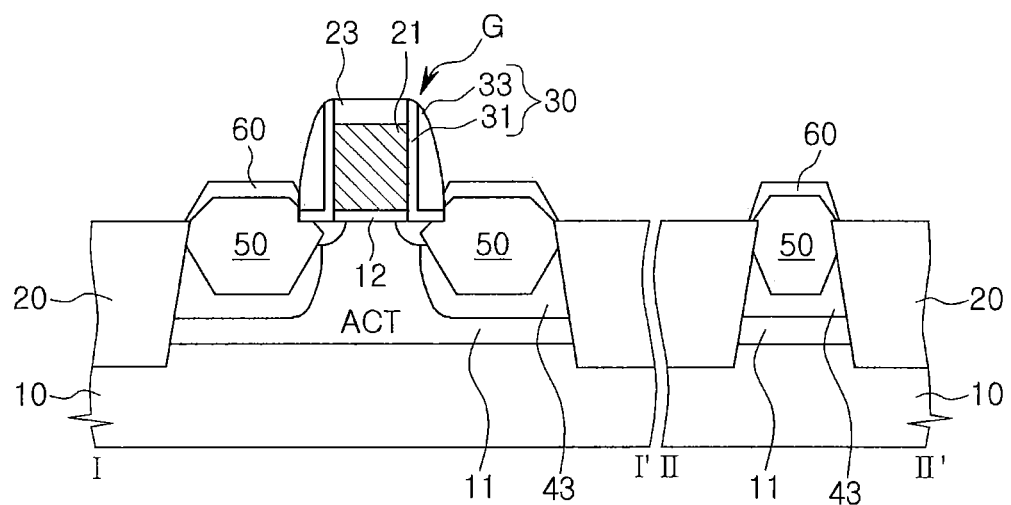

Next, as illustrated in FIG. 6, a SiGe epitaxial layer 50 may be formed in the recess R using a selective epitaxial growth (SEG) process.

The SiGe epitaxial layer 50 may only be selectively grown on an exposed region of the recess R, for example, a clean surface thereof, using the selective epitaxial growth process. Since the hydrogen baking and/or the removal of a silicon surface layer are performed as well as oxide removal in the foregoing processes, undesired impurity elements may be effectively removed together and a high quality epitaxial layer may thus grow on a surface of the recess R.

As in the example embodiment, in the case of a PMOS transistor, in order to apply compressive stress to a channel region, the SiGe epitaxial layer 50 including SiGe having a lattice constant greater than that of silicon of the semiconductor substrate 10 may be formed as described above. The SiGe epitaxial layer 50 is grown on an exposed region of the semiconductor substrate 10, and thus, may have the same crystal structure as that of silicon of the semiconductor substrate 10.

For example, the SiGe epitaxial layer 50 may be formed of silicon germanium ($Si_{1-x}Ge_x$, $0<x<1$). Since a lattice constant of Ge crystal is greater than that of Si crystal, the more an Si atom is substituted with a Ge atom within a silicon crystal lattice, the larger a lattice of $Si_{1-x}Ge_x$ ($0<x<1$) may become. For example, when the SiGe epitaxial layer 50 is grown in the recess R, compressive stress may be generated in a channel region of the PMOS transistor, and as a Ge concentration is increased, a lattice of the epitaxial layer 50 becomes larger, and thus, compressive stress applied to the channel region may be increased.

In the example embodiment, an upper region of the SiGe epitaxial layer 50 may have a Ge concentration higher than that of a lower portion of the SiGe epitaxial layer 50. The lower region of the SiGe epitaxial layer 50 may obtain a required level of high Ge concentration from the upper region while significantly reducing a lattice mismatch between the semiconductor substrate 10 formed of silicon. For example, the SiGe epitaxial layer 50 may be grown using one of solid phase epitaxy (SPE), vapor phase epitaxy (VPE) and liquid phase epitaxy (LPE) methods.

A selective growth process of the SiGe epitaxial layer may be performed by supplying selective etching gas simultaneously with supply of silicon source gas and germanium source gas thereto. The selective etching gas may be supplied together with the silicon source gas, and the SiGe epitaxial layer 50 may not grow on the device isolation film 20, an oxide film or a nitride film, but may only selectively grow in a region of the recess to which silicon (Si) has been exposed. For example, the silicon source gas may be $SiH_3Cl$, dichlorosilane (DCS), trichlorosilane (TCS), hexa-chlorosilane (HCS), $SiH_4$, $Si_2H_6$, or a combination thereof, and the selective etching gas may be HCl, $Cl_2$, or a combination thereof.

The SiGe epitaxial layer 50 may be an epitaxial layer doped with a specific conductivity-type impurity. In the example embodiment, the specific conductivity-type impurity may be a p-type impurity such as boron (B). The doping of impurity on the SiGe epitaxial layer 50 may be performed in-situ in an epitaxial growth process in a manner of doping a p-type impurity. Alternatively, the impurity doping of the SiGe epitaxial layer 50 may also be performed by ion-implanting a p-type impurity in the SiGe epitaxial layer 50 after the selective epitaxial growth is performed. As such, the SiGe epitaxial layer 50 doped with a p-type impurity may be provided together with the low concentration and high concentration impurity regions 41 and 43, as the source/drain regions.

Additionally, a silicon capping layer 60 may be formed on the SiGe epitaxial layer 50. The silicon capping layer 60 may cover an upper surface of the SiGe epitaxial layer 50. The silicon capping layer 60 may prevent a silicide film from penetrating into an interface of the SiGe epitaxial layer 50 and from reacting with the semiconductor substrate 10 in a subsequent silicide formation process.

As in the foregoing example embodiment, a precleaning process according to an example embodiment may be performed with respect to a surface recessed by etching before an SEG process. The precleaning process according to an example embodiment will be described in detail with reference to FIG. 7.

Figure 7:
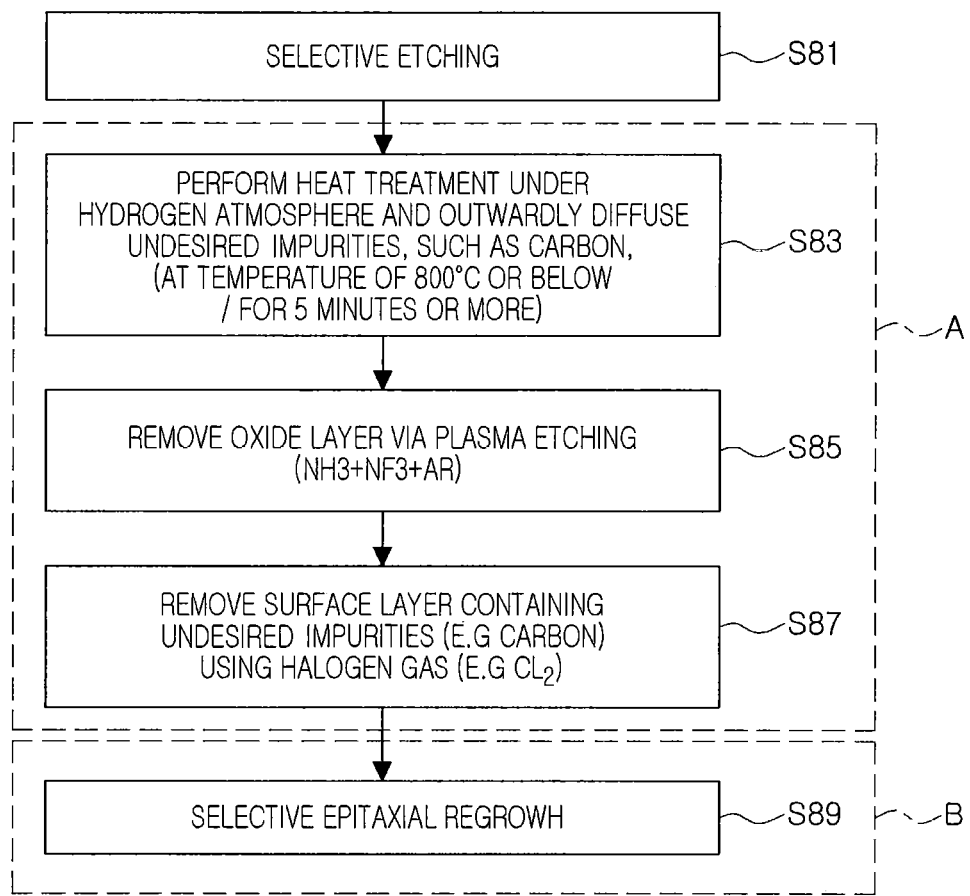
FIG. 7 is a flowchart illustrating a precleaning process according to an example embodiment.

With reference to FIG. 7, first, selective etching may be applied to a surface of a semiconductor substrate in S81. The selective etching process may be a recess forming process for the source and drain described above with reference to FIG. 4.

Next, a precleaning process may be performed on a surface of the semiconductor substrate damaged by etching.

The precleaning process according to the example embodiment may be started with a hydrogen baking process S83. The hydrogen baking process S83 may be performed by heat-treating an etched semiconductor substrate under a hydrogen (H2) atmosphere at a temperature of 800° C. or below. The hydrogen baking process may be performed at a temperature at which a target impurity element such as carbon may be outwardly diffused. A relatively high temperature, for example, a temperature of 800° C. or higher may cause thermal problems due to excessive heat in a semiconductor device, and furthermore, Si migration may occur. For example, in the case of carbon, the hydrogen baking process may be performed at a temperature of 180° C. or higher and further may be performed at a temperature of 500° C. or higher.

The hydrogen baking process may be performed for a sufficient period of time in consideration of a diffusion effect. For example, the hydrogen baking process may be performed for 5 or more minutes, or for 10 or more minutes.

Subsequently, an oxide layer may be removed from a damaged surface using plasma etching in S85. The oxide layer may be effectively removed by injecting an etching gas after generation of plasma. As the etching gas, a mixed gas containing fluorine-based gas may be used. For example, the fluorine-based gas may be at least one selected from CHF3, CF4, C2F6, C4F8, and SF6. In some example embodiments, NH3 and NF3, and a mixed gas of inert gas, for example, argon (Ar), may be used.

In the example embodiment, since the hydrogen baking process is performed prior to an oxide layer removing process, impurity elements may diffuse to the oxide layer from a semiconductor interior in the hydrogen baking process, and the diffused impurity elements may be removed together with the removal of the oxide layer.

Next, a surface layer of an etched portion may be removed using a halogen-based gas in S87. In this case, the surface layer refers to a semiconductor portion configuring the semiconductor substrate, and may indicate a layer in the vicinity of the surface thereof in which an impurity such as carbon has developed or been employed. In the process of removing a silicon surface layer, only a thin surface layer in which a carbon component has been concentrated may be removed, with the thickness of the surface layer within a range not affecting a semiconductor design. For example, the surface layer removed in this process may be controlled to have a thickness of about 5 Å or less.

The halogen gas may include fluorine-based or chlorine-based gas. For example, the fluorine-based or chlorine-based gas may be at least one selected from $Cl_2$, $SiCl_4$, $CHCl_3$, $CH_2Cl_2$, $CCl_4$ and $BCl_3$. In a process of removing the surface layer, in a manner similar to the oxide layer removing process, since the hydrogen baking process is performed prior to the surface layer removing process, impurity elements diffused to the vicinity of the surface in the hydrogen baking process may also be effectively removed.

Next, an epitaxial layer may be selectively regrown on the cleaned surface in S89. In the foregoing process, as the hydrogen baking and the continuous oxide and surface layer removal are performed together as well as the oxide removal, a damaged region may be effectively cleaned with the removal of impurity elements such as carbon. A problem of growth failure due to residual impurities such as carbon may be prevented, and a high-quality epitaxial layer may be grown.

The precleaning process according to the example embodiment has been described as being performed in order of the hydrogen baking S83, the oxide removal S85, and the surface layer removal S87, but is not limited in terms of this order and number of process operations. The respective processes may be performed in a different or optional order and may be performed a plurality of times as needed. In an example embodiment, the precleaning process may be performed with an order of oxide removal, hydrogen baking, and surface layer removal. In another example embodiment, the precleaning process may be performed with an order of primary hydrogen baking, oxide removal, secondary hydrogen baking, and surface layer removal.

In the example embodiment, a series of cleaning process including the hydrogen baking S83, the oxide removal S85, and the surface layer removal S87 may be performed in a single chamber A. After the cleaning process is completed, epitaxial growth may be performed in another process chamber B. For example, without the need to perform a transfer process to another chamber or without the need to stop the cleaning process in order to perform a heat treatment, a plurality of cleaning processes may be performed in-situ in a single chamber. An example of a precleaning apparatus proposed to implement the cleaning process as described above in a single chamber is illustrated in FIG. 8.

Figure 8:
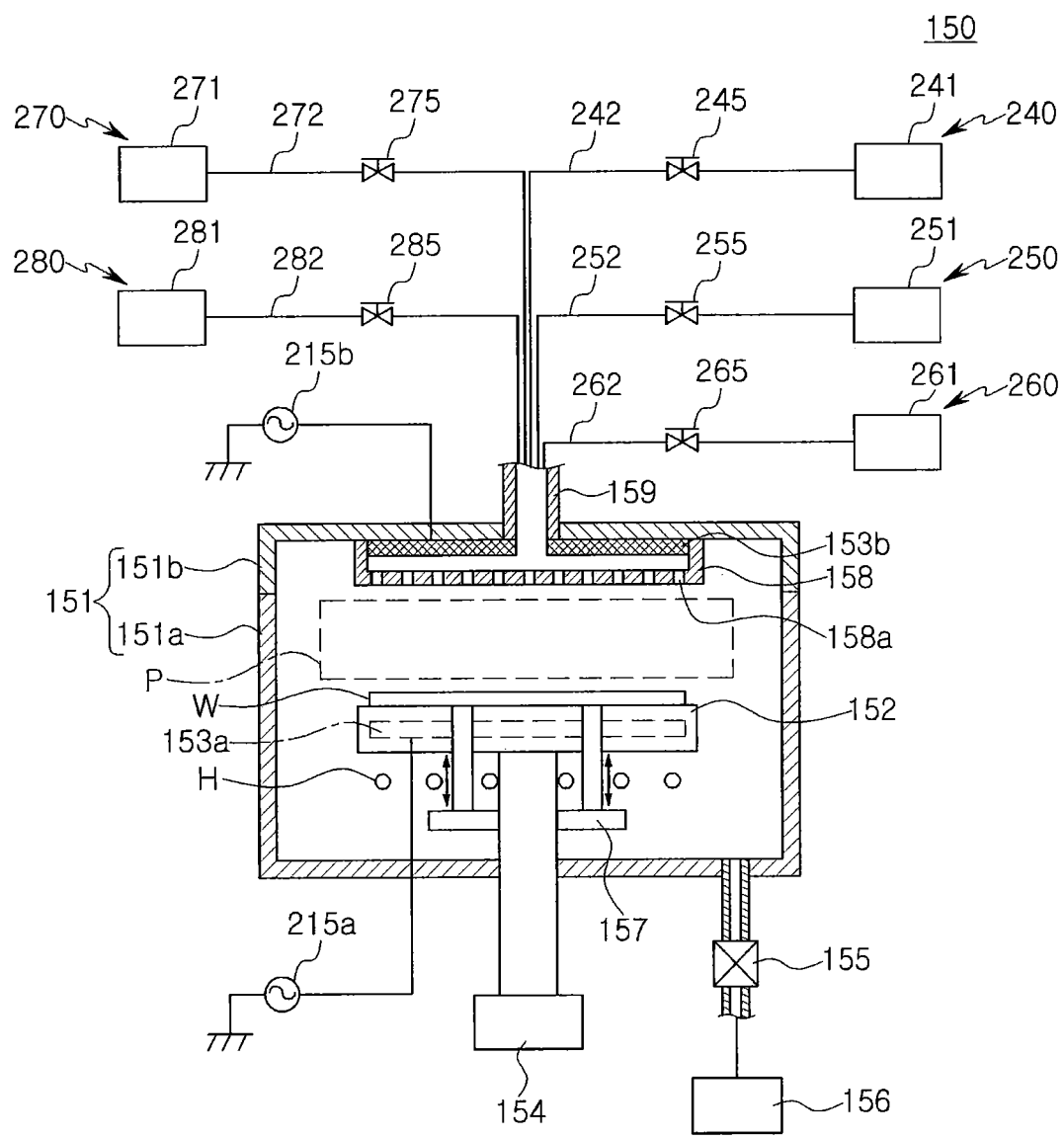
FIG. 8 is a cross-sectional view illustrating an interior of a precleaning apparatus according to an example embodiment.

FIG. 8 is a cross-sectional view illustrating an interior of a precleaning apparatus according to an example embodiment; and With reference to FIG. 8, a precleaning apparatus 150 according to an example embodiment may include a chamber 151 and a substrate support 152 disposed in the chamber 151, and may further include configurations in which hydrogen baking, as well as etching for decontamination, may be performed.

The chamber 151 may have an enclosed internal space therein. The chamber 151 may include a chamber wall 151a and a chamber cover 151b coupled to the chamber wall 151a and provided with a gas injection inlet 159 therein. The chamber 151 may be exposed to a relatively high temperature environment, for example, hydrogen baking, in a manner different from a general plasma processing chamber according to the related art, and thus, may be formed of a material having thermal resistance. For example, the chamber 151 may be formed of ceramic, glass, or quartz. A vacuum pump 156 may be configured to pump air into or from the chamber 151. Such pumping may be controlled by a displacement control unit 155 which may include a valve and may create a low pressure in the interior of the chamber 151 that is lower than an atmospheric pressure (or create a vacuum state).

The substrate support 152 may be disposed in a lower portion of the chamber 151 to support a substrate W to be treated. A shower head 158 may be mounted in an upper end portion of the chamber 151, for example, in the chamber cover 151b, to face or oppose the substrate support 152. The shower head 158 may be connected to the gas injection inlet 159 to disperse cleaning gas or the like within the chamber. The shower head 158 may include a plurality of injection holes 158a allowing for uniform distribution of cleaning gas toward the substrate W.

The substrate support 152 may be configured as an electrostatic chuck to fix the substrate W thereto by electrostatic force. The precleaning apparatus 150 may include a lift 157 allowing for mounting and dismounting of the substrate W to and from the substrate support 152. The lift 157 may be configured to pass through the substrate support 152 and to move upwardly and downwardly as indicated by arrows in FIG. 8.

The precleaning apparatus 150 according to the example embodiment may include a heating unit H for heating the substrate W. The heating unit H may be disposed adjacent the substrate support 152 and may be configured to heat the substrate W to a temperature of 800° C. or below. The heating unit H may be used for heat-treating the substrate W for hydrogen baking in a state in which hydrogen has been supplied within the chamber 151.

The substrate support 152 may be connected to a cooling unit 154. The cooling unit 154 may supply cooling gas or a cooling solution through a circulation pipe disposed in the substrate support 152. For example, the cooling gas may be helium gas.

A first electrode 153a may be disposed within the substrate support 152. The first electrode 153a may be covered by or surrounded by the substrate support 152 to be protected from cleaning gas or the like. A second electrode 153b may be disposed in an upper end portion of the chamber 151, for example, in the chamber cover 151b, to oppose the first electrode 153a. The first electrode 153a may be connected to a first voltage source 215a. The second electrode 153b may be connected to a second voltage source 215b.

Hereinafter, an example of a plasma generation process will be described. The first electrode 153a may be a cathode, and the second electrode 153b may be an anode. Capacitance between the first electrode 153a and the second electrode 153b may be induced. High frequency power of a voltage lower than a voltage of the second electrode 153b may be provided to the first electrode 153a. Cleaning gas injected through the gas injection inlet 159 and the shower head 158 may be accelerated by the high frequency power, may be ionized by collisions thereof, and may generate a secondary electron. The cleaning gas may proceed to electron avalanche, and after electron avalanche breakdown, the cleaning gas may be excited to a plasma (P) state. In this case, the second electrode 153b may be referred to as a plasma generation unit.

The precleaning apparatus 150 according to the example embodiment may include cleaning gas supply units 240, 250, 260 for supplying a variety of cleaning gas to the internal space of the chamber 151 through the shower head 158.

The cleaning gas supply units 240, 250, and 260 for cleaning an oxide may supply predetermined gases through the gas injection inlet 159. The cleaning gas supply units employed in the example embodiment may include first gas supply or first gas supply unit 240 for supplying fluorine-based gas, a second gas supply or second gas supply unit 250 for supplying nitrogen-based gas, and a third gas supply or third gas supply unit 260 for supplying inert gas.

The first to third gas supplies 240, 250, and 260 may include gas storage portions 241, 251 and 261, supply lines 242, 252 and 262 connecting the gas storage portions 241, 251 and 261 and the gas injection inlet 159, and control valves 245, 255 and 265 for controlling a gas feed rate, respectively. A flow rate ratio of respective gas in a mixed gas for oxide etching may be controlled or determined by the control valves 245, 255 and 265. For example, the fluorine-based gas may be at least one selected from $CHF_3$, $CF_4$, $C_2F_6$, $C_4F_8$, and $SF_6$. The nitrogen-based gas may be $NH_3$ and the inert gas may be argon (Ar).

The precleaning apparatus 150 according to the example embodiment may further include a hydrogen gas supply unit 270 for supplying hydrogen gas into the chamber 151. The hydrogen baking for impurity diffusion and removal may be carried out by supplying hydrogen gas to the chamber 151 by the hydrogen gas supply unit 270 and heating the substrate W using the heating unit H.

The precleaning apparatus 150 according to the example embodiment may further include a halogen gas supply unit 280 for supplying a halogen-based gas for silicon etching or a silicon compound to the chamber 151. A surface layer of a damaged region, for example, silicon (Si), may be removed by supplying halogen gas to the chamber 151 using the halogen gas supply unit 280. The halogen gas may include chlorine-based gas. For example, the chlorine-based gas may be at least one selected from $Cl_2$, $SiCl_4$, $CHCl_3$, $CH_2Cl_2$, $CCl_4$ and $BCl_3$.

The hydrogen gas supply unit 270 and the halogen gas supply unit 280 may include gas storage portions 271 and 281, supply lines 272 and 282, and control valves 275 and 285, respectively, in a manner similar to the cleaning gas supply units described above.

As such, the precleaning apparatus 150 according to the example embodiment may be configured in such a manner that the hydrogen baking, the oxide removal and the semiconductor layer removing process are performed in-situ in a single chamber.

Figure 9:
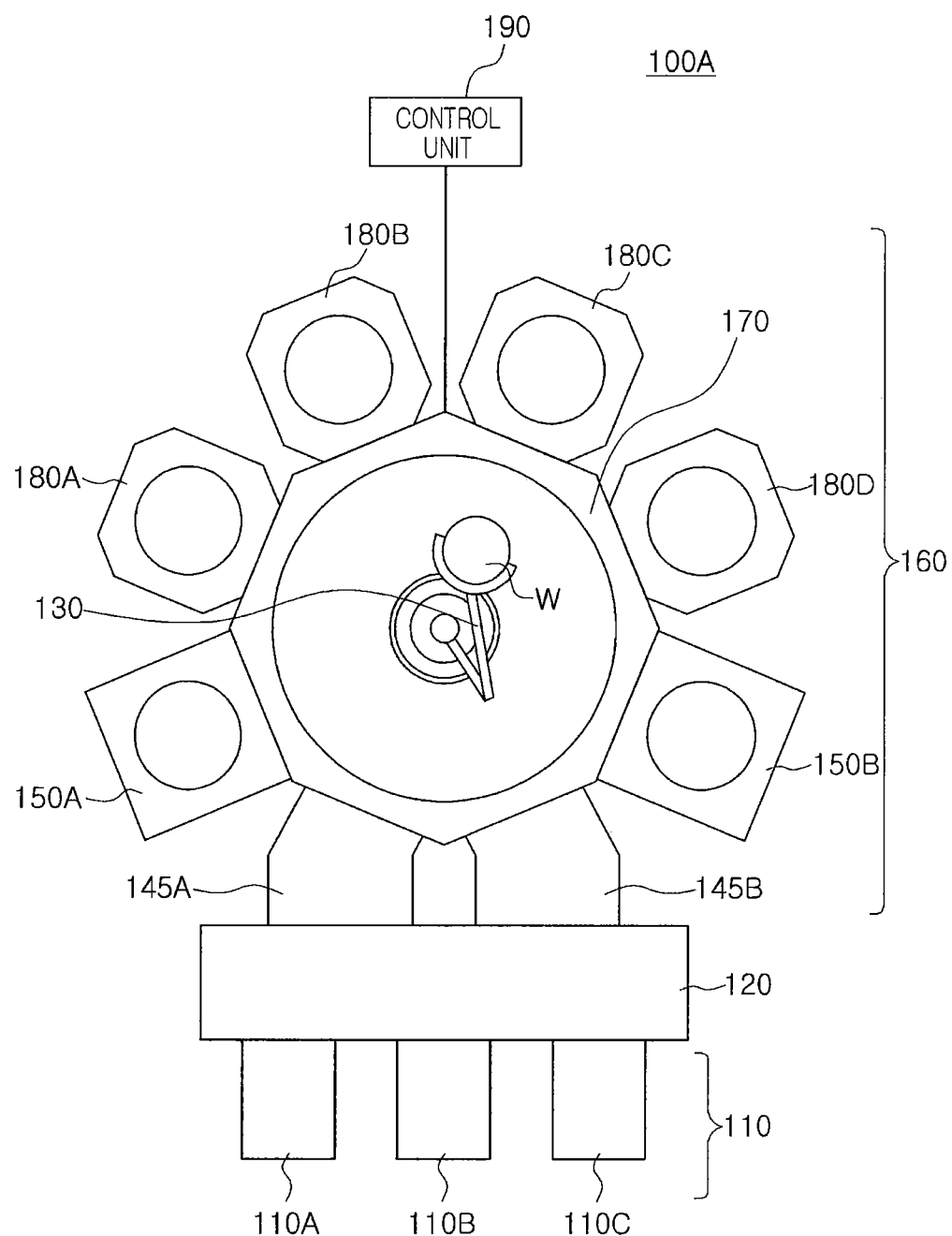
FIGS. 9 and 10 are schematic diagrams illustrating substrate processing systems according to example embodiments.
Figure 10:
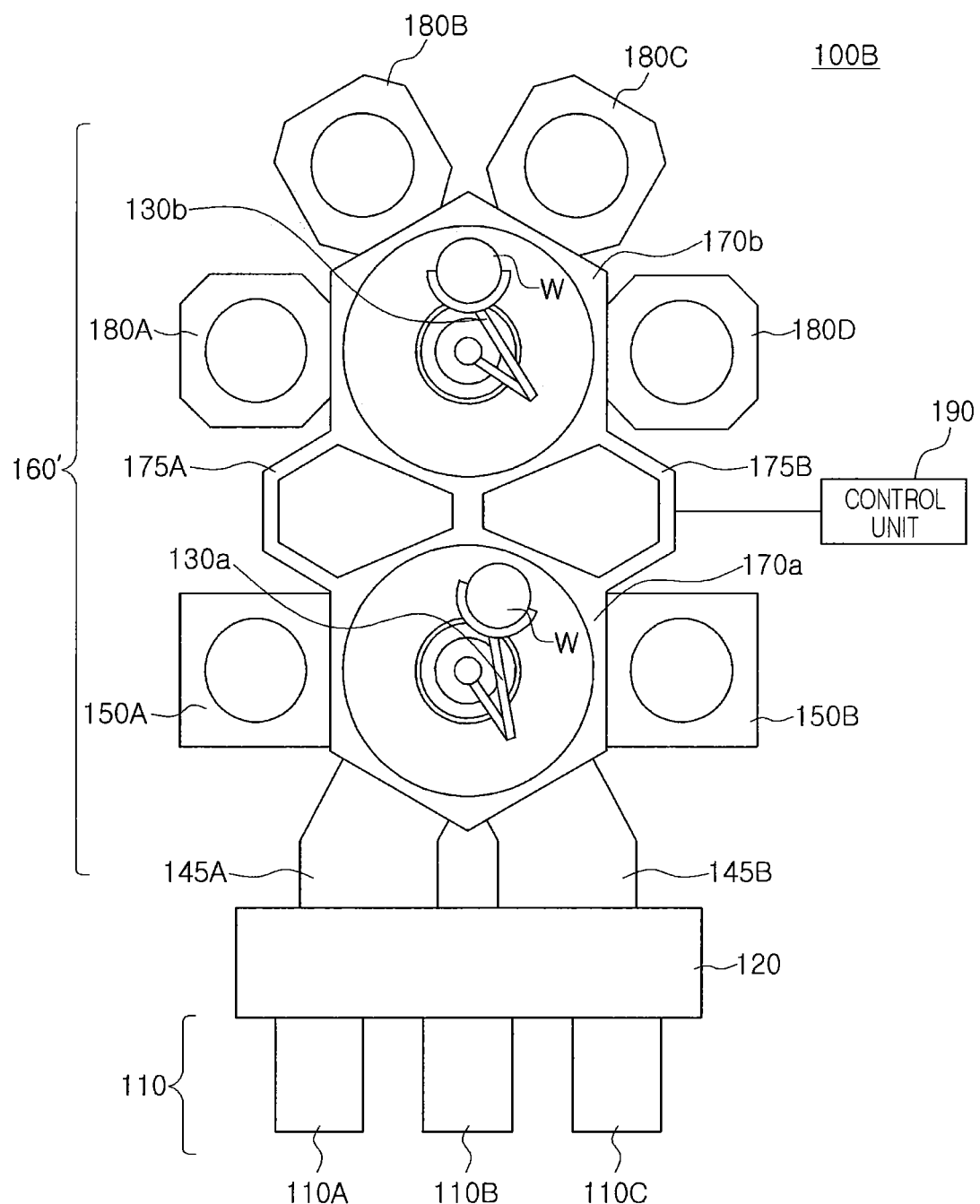

The precleaning apparatus 150 according to the example embodiment may be implemented in a substrate processing system including a plurality of process chambers. FIGS. 9 and 10 are schematic diagrams illustrating a substrate processing system according to example embodiments of the present inventive concept.

With reference to FIG. 9, a substrate processing system 100A according to an example embodiment may include a load port or section 110, a transfer module or section 120, a process module or section 160, and a control unit or controller 190.

The load port 110 may include a container for accommodating a plurality of substrates, and the transfer module 120 may transport the substrates W between the container and the process module 160. The process module 160 may include various types of chambers for processing of the substrates W.

The load port 110 may be disposed on a front end of the transfer module 120 and may be provided as one or more load ports. In this example embodiment, the load port 110 may be provided as three load ports 110A, 110B, 110C. Each of the three load ports 110A, 110B, 110C may include a container.

The transfer module 120 may include a transfer robot in an internal space thereof. The transfer robot may have a configuration similar to that of a transfer robot 130 disposed in the process module 160. The transfer module 120 may withdraw the substrate from the container and transport the withdrawn substrate to the process module 160, or may withdraw the substrate from the process module 160 and transport the withdrawn substrate to the container.

The process module 160 may be configured to perform a variety of processes for processing a substrate as described above. The process module 160 may include load-lock chambers 145A and 145B, a transfer chamber 170, cleaning chambers 150A and 150B, and process chambers 180A, 180B, 180C and 180D. The cleaning chambers 150A and 150B employed in the example embodiment may perform a precleaning process as described above in the foregoing embodiment and, for example, may be configured of the precleaning apparatus 150 described with reference to FIG. 8. The process chambers 180A, 180B, 180C and 180D may be epitaxial deposition chambers or may also include one or more chambers for an etching process performed to form a device structure.

The load-lock chambers 145A and 145B may be disposed between the transfer chamber 170 and the transport module 120. The load-lock chambers 145A and 145B may provide an internal space in which a substrate W may be exchanged between the transfer chamber 170 and the transport module 120. The load-lock chambers 145A and 145B may be configured in such a manner that a reduction of pressure in the internal space thereof may be effected.

The transfer chamber 170 may include the transfer robot 130 in an internal space thereof to transport the substrate W between the chambers provided in the process module 160. The transfer robot 130 may be located in the internal space of the transfer chamber 170. The transfer robot 130 may include an arm movable in horizontal and vertical directions and a rotary plate to which the arm is fixed to provide rotational movement.

The transfer chamber 170 may have a polygonal shape, for example, a hexagonal shape, and two load-lock chambers 145A and 145B, two cleaning chambers 150A and 150B, and four process chambers 180A, 180B, 180C and 180D may be arranged along a periphery of the transfer chamber 170. Alternatively, the shape of the transfer chamber 120 and the arrangement of the chambers may be variously modified. For example, the cleaning chamber may be configured as a single chamber, and other cleaning chambers may perform other processes, for example, an etching process.

The control unit or controller 190 may be programmed to perform and control a variety of processing methods and sequences in the system 100A. For example, the control unit 190 may control a movement of the substrate between the modules and between the cleaning and process chambers, and may also control processing operations by the respective cleaning chambers and process chambers. In detail, in the case of the cleaning chambers, feed gas such as cleaning gas or the like may be selected by the control unit, and a supply amount thereof, an internal temperature of the chamber, and the like may be adjusted, such that the hydrogen baking, the oxide layer removing process, and the silicon layer removing process may be performed in a desired or required sequence.

With reference to FIG. 10, a substrate processing system 100B according to an example embodiment may include a load port or section 110, a transfer module or section 120, a process module or section 160', and a control unit or controller 190, in a manner similar to the foregoing example embodiment.

The substrate processing system 100B may have a structure similar to that of the substrate processing system 100A illustrated in FIG. 9, with the exception of the configuration of a process module. Reference numerals the same as or similar to those described in the foregoing embodiments represent the same or similar elements, and descriptions thereof may be omitted or briefly described in the following description in order to simplify the description.

The process module 160' employed in the example embodiment may include a first transfer chamber 170a disposed to be connected to internal spaces of the load-lock chambers 145A and 145B and including a first transfer robot 130a for transporting the substrate W, and a second transfer chamber 170b having an internal space separated or spaced apart from the first transfer chamber 170a and including a second transfer robot 130b for transporting the substrate W.

The process module 160' may further include connection chambers 175A and 175B disposed between the first and second transfer chambers 170a and 170b to connect internal spaces of the first and second transfer chambers 170a and 170b to each other. The first and second cleaning chambers 150A and 150B may be disposed in the vicinity of the first transfer chamber 170a in such a manner that the first transfer chamber 170a may be connected to internal spaces of the first and second cleaning chambers 150A and 150B. The process chambers 180A, 180B, 180C and 180D may be disposed in the vicinity of the second transfer chamber 170b in such a manner that the second transfer chamber 170b may

What is claimed is:

1. A precleaning apparatus comprising:
a chamber having an internal space in which a substrate is cleaned;
a substrate support disposed in the chamber and configured to support the substrate;
a plasma generation unit disposed in the chamber and configured to generate plasma gas;
a heating unit configured to heat the substrate on the substrate support;
a cleaning gas supply unit configured to supply gas for oxide etching to the internal space of the chamber;
a hydrogen gas supply unit configured to supply hydrogen gas to the internal space of the chamber; and
a halogen gas supply unit configured to supply halogen gas for silicon etching or silicon compound etching to the internal space of the chamber,
wherein the cleaning gas supply unit comprises a first gas supply unit configured to supply fluorine-based gas, a second gas supply unit configured to supply nitrogen-based gas, and a third gas supply unit configured to supply inert gas.

2. The precleaning apparatus of claim 1, wherein the halogen gas comprises chlorine-based gas.

3. The precleaning apparatus of claim 2, wherein the chlorine-based gas is at least one of $Cl_2$, $SiCl_4$, $CHCl_3$, $CH_2Cl_2$, $CCl_4$ and $BCl_3$.

4. The precleaning apparatus of claim 1, wherein the fluorine-based gas is at least one of $CHF_3$, $CF_4$, $C_2F_6$, $C_4F_8$ and $SF_6$.

5. The precleaning apparatus of claim 1, wherein the heating unit is configured to heat the substrate to a temperature of 800° C. or below.

6. The precleaning apparatus of claim 5, wherein the chamber is formed of ceramic, glass, or quartz.

7. The precleaning apparatus of claim 1, further comprising a shower head configured to discharge gas supplied from the cleaning gas supply unit to be distributed to the substrate.

8. The precleaning apparatus of claim 1, wherein the first gas supply unit comprises a first gas storage portion and a first gas supply line connecting the first gas storage portion and the chamber,
the second gas supply unit comprises a second gas storage portion and a second gas supply line connecting the second gas storage portion and the chamber,
the third gas supply unit comprises a third gas storage portion and a third gas supply line connecting the third gas storage portion and the chamber,
the hydrogen gas supply unit comprises a hydrogen gas storage portion and a hydrogen gas supply line connecting the hydrogen gas storage portion and the chamber, and
the halogen gas supply unit comprises a halogen gas storage portion and a halogen gas supply line connecting the halogen gas storage portion and the chamber.

9. The precleaning apparatus of claim 1, wherein the heating unit is configured to heat the substrate to a temperature of between 500° C. and 800° C.

10. A precleaning apparatus comprising:
a chamber;
a substrate support in an internal space of the chamber and configured to support a substrate having a contaminated or damaged portion;
a heating unit configured to heat the substrate on the substrate support;
a hydrogen gas supply unit configured to supply hydrogen gas to the internal space of the chamber to heat-treat the heated substrate;
a plasma generation unit disposed in the chamber and configured to generate plasma gas;
a cleaning gas supply unit configured to supply gas to the internal space of the chamber to remove an oxide from the contaminated or damaged portion of the substrate using plasma etching; and
a halogen gas supply unit configured to supply halogen gas to the internal space of the chamber to remove a surface layer of the contaminated or damaged portion of the substrate,
wherein the cleaning gas supply unit comprises a first gas supply unit configured to supply fluorine-based gas to the internal space of the chamber, a second gas supply unit configured to supply nitrogen-based gas to the internal space of the chamber, and/or a third gas supply unit configured to supply inert gas to the internal space of the chamber.

11. The precleaning apparatus of claim 10, wherein the halogen gas comprises a chlorine-based gas that is at least one of $Cl_2$, $SiCl_4$, $CHCl_3$, $CH_2Cl_2$, $CCl_4$ and $BCl_3$.

12. The precleaning apparatus of claim 10, wherein the heating unit is configured to heat the substrate to a temperature of no greater than 800° C.

13. The precleaning apparatus of claim 12, wherein the chamber is formed of ceramic, glass, or quartz.

* * * * *